SOLDER FOR CONTACT-BONDING A BODY CONSISTING OF A GERMANIUM-SILICON ALLOY

Filed July 18, 1967

United States Patent Office 3,544,311

Patented Dec. 1, 1970

3,544,311

SOLDER FOR CONTACT-BONDING A BODY CONSISTING OF A GERMANIUM-SILICON ALLOY

Eugen Szabo de Bucs, Erlangen, and Gerhard Oesterhelt, Nuremberg, Germany, assignors to Siemens Aktiengesellschaft, Berlin, Germany, a corporation of Germany Filed July 18, 1967, Ser. No. 654,115
Claims priority, application Germany, July 19, 1966, S 104,882
Int. Cl. C22c *31/00*
U.S. Cl. 75—134 7 Claims

ABSTRACT OF THE DISCLOSURE

Solder for contact-bonding a body consisting of germanium-silicon alloy consists of germanium and silicon alloy from Groups IV and V of the Periodic Table, the relative proportions of the components being such that the melting point of the solder is just below the melting point of the germanium-solicon alloy. Method of producing the solder includes placing the alloy components in a vertically disposed melting tube closed at the bottom end thereof, inductively fusing the components, and rotating the melting tube about its axis at least while the solder is thereafter permitted to harden.

Figures 1, 2:
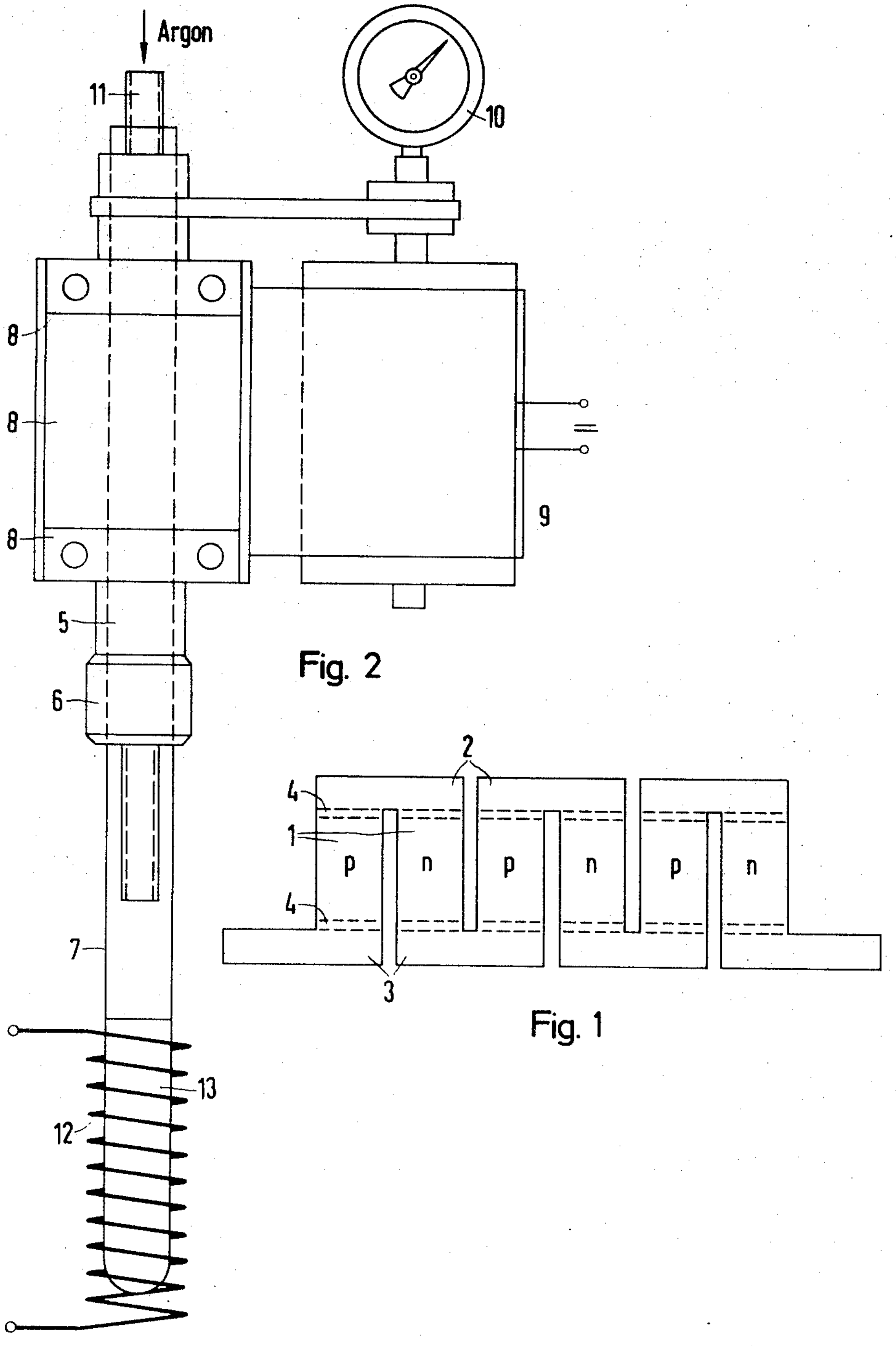

Our invention relates to solder for contact-bonding a body consisting of a germanium-silicon alloy, wherein the solder also includes germanium and silicon alloying components, and method for producing the solder.

In the manufacture of thermoelectric devices of p and n-conductive thermocouple legs, which are connected by means of electrically conductive contact bridges, specific requirements must be imposed upon the contact bonding of the thermocouple legs with the contact bridges. The contact bond must be mechanically rigid or stable and must be rugged, the coefficient of expansion of the material of the contact zone must closely coincide with the coefficient of expansion of the thermocouple leg materials and the bridge materials, and the contact zone moreover must possess the least possible thermal and electrical resistance since the efficiency of a thermoelectric generator is dependent thereon.

It has been known to fuse the thermocouple legs to the contact bridges in a high frequency inductive field. However, such known bonding method permits the alloy components of the thermoelectrically active semiconductor material of the thermocouple legs to separate out. The resulting inhomogeneities of the semiconductor alloy resulting therefrom, due to which the specific electrical resistivity is altered and which generally causes a decrease in thermal resistance, are linked with the effectivity of the material of the thermocouple legs. In addition, due to the known fusing process, the doping of the thermoelectrically active semiconductive material can be altered, which is also linked with a reduction in the effectivity of the thermocouple leg material. This reduction in effectivity can cause a reduction in the efficiency of the thermoelectric device. Furthermore, by utilizing this known fusion method, uniform contact-bonding over the entire surface of the contact zone between the thermocouple leg and the contact bridges cannot be expected. The high frequency induction field acts from without and, in an unfavorable case, locations that are not contact-bonded will exist in the interior of the contact zone, acocrdingly producing a corresponding reduction in effectivity. At the very least, the contact-bond over the entire surface of the contact zone is not free of tension when this known fusing process is employed. Consequently, devices which are produced by this known fusing method will not be stable when subjected to frequent temperature change or mechanical influenses, and maintenance-free operation of the thermoelectric device is accordingly not to be expected.

It is also known to solder thermocouple legs on the contact bridges. The solders employed in this known process have to be compatible with the material of the thermocouple legs and the material of the contact bridges. It is also known to contact-bond thermocouple legs consisting of a germanium-silicon alloy by employing a solder consisting of doped germanium and silicon, the solder due to a higher germanium content having a melting point below the melting point of the thermoelectrically active semiconductor alloy. By employing this solder, great assurance is obtained that the doping of the thermocouple legs will not vary and that the alloy material of the thermocouple legs will not become separated out. Germanium-silicon alloys in the form of thermoelectrically active leg material have found a use, however, only in thermoelectric generators. The efficiency of a thermoelectric generator, however, critically depends upon the amount of the temperature difference between the hot and the cold side of the thermoelectric generator. In order to increase the efficiency, the operating temperature of the hot side of the generator must be selected so that it is as high as will be permitted by the melting temperature of the material of the thermocouple legs. The melting point of a solder consisting of a germanium-silicon compound can approach, however, only up to about 300° C. from the melting point of the thermoelectric effective germanium-silicon alloy of the leg of the thermocouple. If such solder is used therefore on the hot side of a thermoelectric generator for contact-bonding the thermocouple leg consisting of a germanium-silicon alloy, the temperature of the hot side of the generator cannot then approach close enough to the melting point of the thermocouple leg. The temperature difference possible between the hot and cold side of the generator is therefore not the maximum possible value and the optimum efficiency of the thermoelectric generator cannot be attained. Moreover, due to the brittleness of the germanium-silicon solder, it can be advantageously applied, without time-consuming further processing, only in pulverulent form on the contact bonding locations of the thermocouple leg and the contact bridges. However, there is no assurance thereby that the solder layer has the same thickness over the entire surface of the contact zone. Thus, a contact zone is obtained having an undefined composition or structure which again results in a reduction in the efficiency of the thermoelectric generator.

It is accordingly an object of our invention to provide solder wherewith a contact zone can be formed whose coefficient of expansion is accommodated to that of the semiconductor and bridge materials.

Another object of the invention is to provide such a solder which will produce a contact zone having the greatest possible electrical and thermal conductivity and which is resistant to oxidation.

It is also an object of our invention to provide a solder which will not cause separating out or change in the doping of the thermocouple leg material.

An additional object of our invention is to provide a solder which will effect a permanent, tension-free and mechanically rigid bond.

It is yet another object of our invention to provide a solder whose melting point is just below the melting point of the germanium-silicon alloy of the thermocouple leg.

With the foregoing and other objects in view we provide in accordance with our invention, solder consisting of germanium and silicon alloy and having as a third component a metal selected from Groups IV and V of the Periodic Table, the proportions of the components being such that the melting point of the solder is slightly below the melting point of the germanium-silicon compound.

In accordance with a further feature of our invention, the proportion of the alloy components are preferably selected as follows:

(a) The proportional content of the metal of the solder is the same as proportional content of the metal in an alloy of silicon and a metal selected from Group IV or V of the Periodic Table of which the contact bridge material is formed, the metal content of the solder, corresponding at least substantially to a dystectic or eutectic point, generically referred to herein as a tectic point, the terms dystectic and eutectic being defined, respectively, in Webster's New International Dictionary, second edition, Unabridged, as "of minimum fusibility" and "of maximum fusibility";

(b) The sum of the germanium and silicon contents of the solder is the same as that of the silicon content in the metal-silicon alloy, whereby the proportion of both component quantities is determined by the amount of germanium that must replace the silicon in the metal-silicon alloy in order to attain the required melting point of the solder.

The solder of our invention has the following advantages:

When performing the contact-bonding process no change occurs in the doping of the semiconductor material of the thermocouple leg because most of the metals of Groups IV and V of the Periodic Table do not dope a germanium-silicon alloy. The solder has a metallic component, and is therefore able to be applied in the form of discs or plates on the contact localities, whereby contact zones of defined composition are obtainable with the solder, guaranteeing an optimum efficiency of the thermoelectric generator.

Furthermore, due to the metallic component, the contact bond is exceptionally strong mechanically.

The contact-bond has great ruggedness, high tensile strength and great resistance to temperature change.

The composition of the solder furthermore assures that the contact-bond is resistant both to oxidation and corrosion.

The thermal and electrical conductivities of the solder are determining factors for the final selection of the most desirable ratio of components. Solders that are particularly advantageous are of the following composition:

$Ti_{0.17}(Ge_xSi_{1-x})_{0.83}$ wherein $0.4 \leqslant x \leqslant 0.6$ $V_{0.12}(Ge_xSi_{1-x})_{0.88}$ wherein $0.4 \leqslant x \leqslant 0.6$ $Nb_{0.12}(Ge_xSi_{1-x})_{0.88}$ wherein $0.4 \leqslant x \leqslant 0.6$ $Ta_{0.06}(Ge_xSi_{1-x})_{0.94}$ wherein $0.3 \leqslant x \leqslant 0.6$ Alloying with the solder must be as homogeneous as possible in order not to change the composition of the material over the entire surface of the contact zone. In accordance with a further development of the invention of this application, this is achieved with the solder of the invention by placing the alloying components in a vertically disposed melting tube having a closed bottom end and inductively fusing them therein, the melting tube being set in rotation about its axis at least when the solder is solidifying.

It is furthermore advantageous also to expose the melt as it is solidifying to a high frequency inductive field with a diminishing field strength.

Homogeneous semiconductor members that are free of flaws or cracks are able to be produced by the described method of our invention. By means of the rotation of the material, at least while it is being solidified, there is not only produced a thorough intermixing of the material but also a sink is formed in the melt wherein the solidifying melt is expanded, because the solders of our invention have negative coefficients of expansion.

Other features which are characteristic for the invention are set forth in the appended claims.

Although the invention is illustrated and described herein as embodied in solder for contact-bonding a body consisting of germanium-silicon alloy and method of producing the same, it is nevertheless not intended to be limited to the details shown, since various modifications and changes may be made therein without departing from the spirit of the invention and within the scope and range of equivalence of the claims.

The composition and method of production of the invention, however, together with additional objects and advantages, will be best understood from the following description of specific embodiments when read in connection with the accompanying drawings, in which:

FIG. 1 is a thermoelectric device having thermocouple legs which are contact-bonded to contact bridges with the solder of our invention; and FIG. 2 is a diagrammatic longitudinal view of apparatus for carrying out the method of production according to our invention.

Referring now to the drawings, and particularly to FIG. 1 thereof, there is illustrated a thermoelectric device wherein p- and n-conductive thermocouple legs 1 are connected by contact bridges 2 and 3 so that the legs 1 extend electrically in series and thermally in parallel. The thermocouple legs 1 are contact-bonded to the contact bridges 2 and 3 by means of a solder so that a contact zone 4 is formed. The thermocouple legs consist of a germanium-silicon alloy formed with 30 atom percent of germanium and the remainder of silicon. The p-conductive legs are doped with boron, gallium or indium, the n-conductive legs are doped with phosphorus, arsenic or antimony. The material of the bridges 2 and 3 is preferably an alloy of silicon with any metal from Groups IV, V or VI of the Periodic System, with the exception of chromium, or in other words, either Ti, Zr, Hf, V, Nb, Ta, Mo or W. The liquid-fusion point of the germanium-silicon alloy is located between 1330 and 1340° C. The melting point of the contact bridges 2 and 3 remains above this value. A solder having the composition in accordance with our invention is then employed for contact-bonding the bridges 2 and 3 to the thermocouple legs 1. A disc of solder, having a thickness corresponding substantially to the thickness of the contact zone, is placed between the ends of the thermocouple legs and the contact bridges, and the contact bridges are then fused to the thermocouple legs at the fusion temperature of the solder. The desired melting point of the solder can be varied for all the compositions of solder according to our invention by varying the germanium content thereof. It is thereby possible to maintain the solder melting point just below the melting point of the material of the thermocouple legs. The temperature difference between the hot and the cold side of the thermoelectric generator can therefore be maintained as great as possible so as to increase the efficiency of the thermoelectric device. Following are examples of several solid melting points and in the first three examples there is noted the change in the solder melting point with the change in the content of germanium.

| | T (°C.) |
|---|---|
| $Ti_{0.17}(Ge_{0.4}Si_{0.6})_{0.83}$ | 1220 |
| $Ti_{0.17}(Ge_{0.5}Si_{0.5})_{0.83}$ | 1200 |
| $Ti_{0.17}(Ge_{0.6}Si_{0.4})_{0.83}$ | 1180 |
| $V_{0.12}(Ge_{0.4}Si_{0.6})_{0.88}$ | 1250 |
| $Nb_{0.12}(Ge_{0.4}Si_{0.6})_{0.88}$ | 1250 |
| $Ta_{0.06}(Ge_{0.3}Si_{0.6})_{0.94}$ | 1270 |

When employing such solders according to our invention, temperatures of the hot side of a thermoelectric generator are realized which are 50° C. lower than the respective melting point of the solder.

Apparatus for carrying out the method of production of the solder of our invention is shown in FIG. 2. The apparatus is formed of two parts, one of which is for carrying out the rotation or centrifuging operation and the other serves for heating the charge. The centrifuging device comprises a rotary compression tube 5, with a compression portion 6, in which the melting tube 7, which can be formed, for example, from quartz, is insertable and is able to be centrally braced. The compression tube 5 is passed through ball bearings 8 which are mounted in a metal sleeve and which are driven by a motor 9 having a controllable rotary speed. An r.p.m. indicator 10 is provided for regulating the rotary speed of the separator tube. In the compression tube 5 there is located another tube 11 through which argon, for example, is passed in order to produce an inner atmosphere. The heating portion of the illustrated apparatus comprises a high frequency induction coil 12 which is energized by a nonillustrated high frequency generator. The induction heating coil is so arranged that it completely surrounds the melt charge 13. Each individual compression casting is prepared by weighing out the suitable quantities of alloy components. The previously well intermixed starting material is placed in the quartz tube and is fused by means of the high frequency induction field. It is advantageous to rotate the tube while the solder material is being melted so that a good intermixing of the alloy is afforded. After the solder is melted and while it is solidifying, the high frequency energy is reduced; however, the melt is kept in rotation. A rotary speed of about 1500 revolutions per minute has been found to be favorable for a charge having a diameter of 9 mm. After it has solidified, the fused piece is removed from the quartz glass. The homogeneous alloy produced is thus obtained in the form of cylindrical bodies from which discs are subsequently sliced with which the contact-bonding of the thermocouple legs to the contact bridges can be carried out directly.

We claim:

1. Solder for contact-bonding a body formed of germanium-silicon alloy, consisting essentially of germanium and silicon alloy components and a third component consisting of a metal selected from the group consisting of Ti, Zr, Hf, V, Nb, Ta, Mo and W, said components being in such relative proportions that the melting point of the solder is relatively slightly below the melting point of the germanium-silicon alloy, the metal of the solder being in substantially the same proportion as that of the metal in an alloy of silicon with the third component metal, said alloy corresponding substantially to a tectic point, and the sum of the germanium and silicon portions of the solder being substantially the same as the silicon portion in the metal-silicon alloy, the ratio of both portions being determined by that amount of germanium which must replace the silicon in the metal-silicon alloy in order to obtain a solder having a desired melting point.

2. Solder according to claim 1, having the composition $Ti_{0.17}(Ge_xSi_{1-x})_{0.83}$ wherein $0.4 \leqslant x \leqslant 0.6$.

3. Solder according to claim 1, having the composition $V_{0.12}(Ge_xSi_{1-x})_{0.88}$ wherein $0.4 \leqslant x \leqslant 0.6$.

4. Solder according to claim 1, having the composition $Nb_{0.12}(Ge_xSi_{1-x})_{0.88}$ wherein $0.4 \leqslant x \leqslant 0.6$.

5. Solder according to claim 1, having the composition $Ta_{0.06}(Ge_xSi_{1-x})_{0.94}$ wherein $0.3 \leqslant x \leqslant 0.6$.

6. Solder according to claim 1, wherein said tectic point is the dystectic point.

7. Solder according to claim 1, wherein said tectic point is the eutectic point.

References Cited

UNITED STATES PATENTS

| | | | |
|---|---|---|---|
| 3,298,777 | 1/1967 | Brixner | 75—134 X |
| 3,338,753 | 8/1967 | Horsting | 136—237 |
| 3,342,567 | 9/1967 | Dingwall | 136—239 X |

L. DEWAYNE RUTLEDGE, Primary Examiner

E. L. Weise, Assistant Examiner

U.S. Cl. X.R.

136—237

F-3597

PO-1050
(5/69)

UNITED STATES PATENT OFFICE
CERTIFICATE OF CORRECTION

Patent No. 3,544,311 Dated December 1, 1970

Inventor(s) EUGEN SZABO DE BUCS et al

It is certified that error appears in the above-identified patent and that said Letters Patent are hereby corrected as shown below:

In the heading the German priority number should read as follows: --S 104882 VIa/49h--

SIGNED AND SEALED
MAR 2 1971

(SEAL)
Attest:

Edward M. Fletcher, Jr.
Attesting Officer

WILLIAM E. SCHUYLER,
Commissioner of Paten